US012558993B2

(12) United States Patent
Ishii

(10) Patent No.: US 12,558,993 B2
(45) Date of Patent: Feb. 24, 2026

(54) COMPUTING SYSTEM, BATTERY DETERIORATION PREDICTING METHOD, AND BATTERY DETERIORATION PREDICTING PROGRAM

(71) Applicant: Panasonic Intellectual Property Management Co., Ltd., Osaka (JP)

(72) Inventor: Yohei Ishii, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 547 days.

(21) Appl. No.: 18/006,363

(22) PCT Filed: Jul. 19, 2021

(86) PCT No.: PCT/JP2021/026998
§ 371 (c)(1),
(2) Date: Jan. 20, 2023

(87) PCT Pub. No.: WO2022/024847
PCT Pub. Date: Feb. 3, 2022

(65) Prior Publication Data
US 2023/0286415 A1 Sep. 14, 2023

(30) Foreign Application Priority Data
Jul. 29, 2020 (JP) ................................. 2020-128058

(51) Int. Cl.
*B60L 58/16* (2019.01)
*G01R 31/367* (2019.01)
*G01R 31/392* (2019.01)
(52) U.S. Cl.
CPC ............ *B60L 58/16* (2019.02); *G01R 31/367* (2019.01); *G01R 31/392* (2019.01)

(58) Field of Classification Search
CPC .... B60L 58/16; B60L 3/0046; B60L 2250/16; B60L 2250/18; B60L 2260/50;
(Continued)

(56) References Cited

U.S. PATENT DOCUMENTS

| | | | |
|---|---|---|---|
| 2016/0209473 A1 | 7/2016 | You et al. | |
| 2017/0212170 A1* | 7/2017 | Torai ................... | H01M 10/482 |
| 2021/0190877 A1 | 6/2021 | Isa et al. | |

FOREIGN PATENT DOCUMENTS

| | | | | |
|---|---|---|---|---|
| CN | 107819339 A | * | 3/2018 | .......... H02J 7/00041 |
| JP | 2015-021934 | | 2/2015 | |

(Continued)

OTHER PUBLICATIONS

The EPC Office Action dated Dec. 22, 2023 for the related European Patent Application No. 21850840.6.
(Continued)

*Primary Examiner* — Tung S Lau
(74) *Attorney, Agent, or Firm* — Rimon P.C.

(57) ABSTRACT

Deterioration regression curve generation unit generates a deterioration regression curve of each battery by performing curve regression on a plurality of SOHs specified in time series for each battery. Coefficient regression function generation unit generates a regression function of a deterioration coefficient using an average travel distance or an average discharge amount per unit period of a plurality of electrically-driven mobile units as an independent variable and using a deterioration coefficient of the deterioration regression curve of each of the plurality of the batteries as a dependent variable. Deterioration prediction unit specifies the average travel distance or the average discharge amount per unit period in accordance with the received change in the travel conditions, applies the average travel distance or the average discharge amount per unit period to the regression function of the deterioration coefficient to specify a deterio- (Continued)

ration coefficient after the change in the travel conditions, and uses the deterioration coefficient to change the deterioration regression curve of battery mounted in electrically-driven mobile unit.

6 Claims, 8 Drawing Sheets

(58) Field of Classification Search
CPC .... B60L 3/12; B60L 2240/70; B60L 2260/42; B60L 58/12; G01R 31/367; G01R 31/392; H01M 10/42; H01M 10/48; Y02E 60/10; Y02T 10/70
See application file for complete search history.

(56) References Cited

FOREIGN PATENT DOCUMENTS

| WO | 2018/147194 A1 | 8/2018 | |
|----|----------------|--------|--------------|
| WO | 2019/097357 A1 | 5/2019 | |
| WO | WO 2019230069 A1 * | 12/2019 | .......... H01M 10/482 |

OTHER PUBLICATIONS

International Search Report of PCT application No. PCT/JP2021/026998 dated Sep. 28, 2021.
The EPC Office Action dated Jul. 22, 2025 for the related European Patent Application No. 21850840.6.

* cited by examiner $$SOH = w_0 + w_1\sqrt{T}$$

Average travel distance [km/day]

FIG. 9

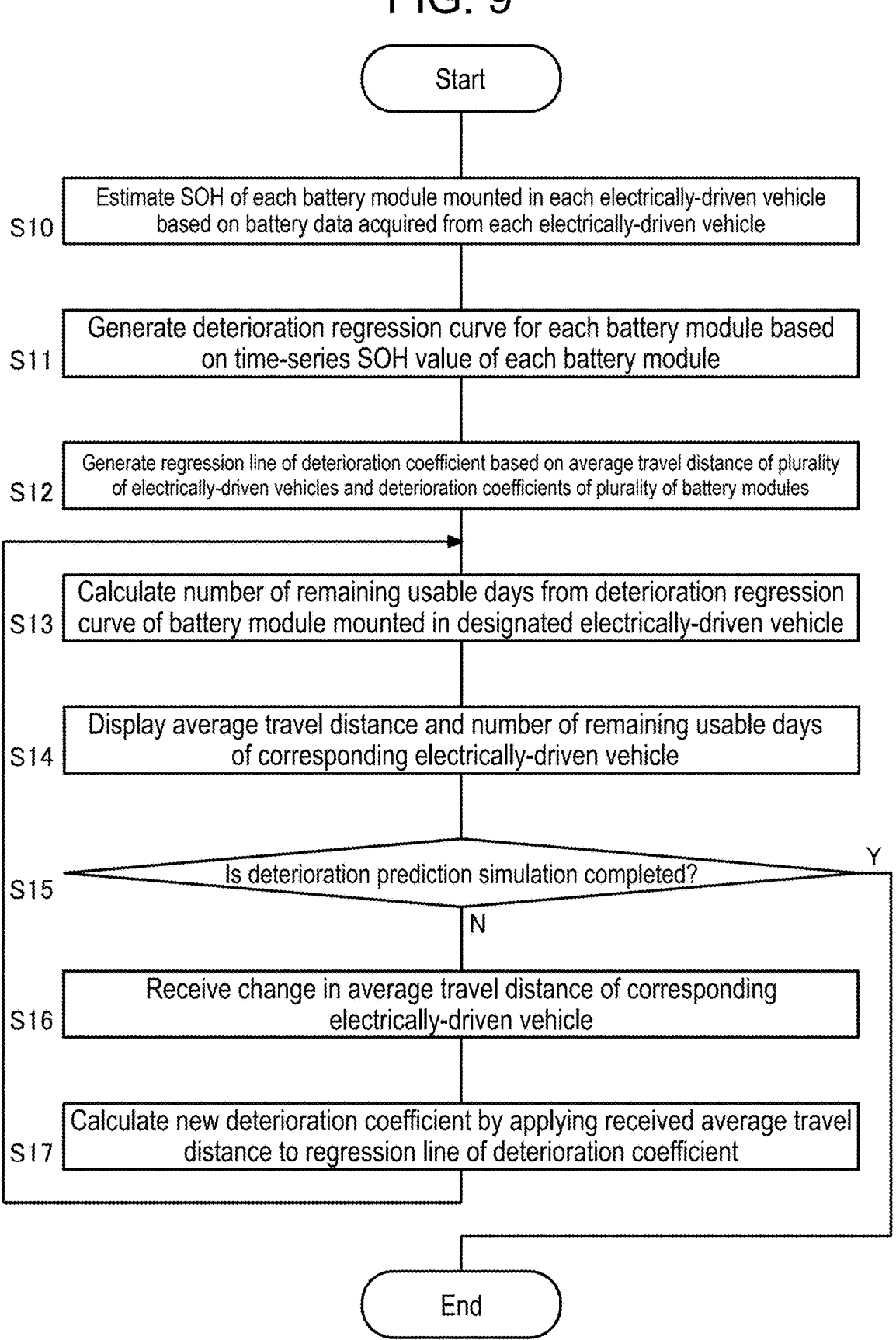

Start

S10  Estimate SOH of each battery module mounted in each electrically-driven vehicle based on battery data acquired from each electrically-driven vehicle S11  Generate deterioration regression curve for each battery module based on time-series SOH value of each battery module S12  Generate regression line of deterioration coefficient based on average travel distance of plurality of electrically-driven vehicles and deterioration coefficients of plurality of battery modules S13  Calculate number of remaining usable days from deterioration regression curve of battery module mounted in designated electrically-driven vehicle S14  Display average travel distance and number of remaining usable days of corresponding electrically-driven vehicle S15  Is deterioration prediction simulation completed?    Y
     N S16  Receive change in average travel distance of corresponding electrically-driven vehicle S17  Calculate new deterioration coefficient by applying received average travel distance to regression line of deterioration coefficient End

COMPUTING SYSTEM, BATTERY DETERIORATION PREDICTING METHOD, AND BATTERY DETERIORATION PREDICTING PROGRAM

CROSS-REFERENCE TO RELATED APPLICATIONS

This application is a U.S. national stage application of the PCT International Application No. PCT/JP2021/026998 filed on Jul. 19, 2021, which claims the benefit of foreign priority of Japanese patent application No. 2020-128058 filed on Jul. 29, 2020, the contents all of which are incorporated herein by reference.

TECHNICAL FIELD

The present disclosure relates to a computing system, a battery deterioration predicting method, and a battery deterioration predicting program configured to predict deterioration of a battery mounted in an electrically-driven mobile unit.

BACKGROUND ART

Hybrid vehicles (HV), plug-in hybrid vehicles (PHV), and electric vehicles (EV) have become widespread in recent years. In these electrically-driven vehicles, a secondary battery such as a lithium ion battery is mounted as a key device. Business operators such as a delivery business operator (home delivery business operator), a bus business operator, a taxi business operator, a rental car business operator, and a car sharing business operator using an electrically-driven vehicle determine a replacement time of the electrically-driven vehicle and review operation management based on deterioration prediction of secondary batteries mounted in a plurality of the electrically-driven vehicles under management.

Although a stationary storage battery is assumed, the following method has been proposed as a method of predicting deterioration of the storage battery. In this method, use conditions such as a state of charge (SOC), a temperature, and a current rate of the storage battery are classified into categories, time used for each category when a plurality of the storage batteries are used is recorded, and a deterioration coefficient for each category is obtained to perform deterioration prediction (see, for example, PTL 1).

CITATION LIST

Patent Literature

PTL 1: Unexamined Japanese Patent Publication No. 2015-21934

SUMMARY OF THE INVENTION

Unlike a stationary storage battery, a battery mounted in an electrically-driven vehicle may have a large current change in a short time, and thus it is difficult to obtain a deterioration coefficient for each category. In addition, a method of obtaining the deterioration coefficient for each category has a complicated computing process.

The present disclosure has been made in view of such a situation, and an object of the present disclosure is to provide a technique of easily predicting deterioration of a battery mounted in an electrically-driven mobile unit.

In order to solve the above-described problem, a computing system according to an aspect of the present disclosure includes: a data acquisition unit configured to acquire travel data including data of a battery mounted in each of a plurality of electrically-driven mobile units; an SOH specification unit configured to specify an SOH of the battery mounted in each of the plurality of electrically-driven mobile units based on the battery data included in the acquired travel data; a deterioration regression curve generation unit configured to perform curve regression on a plurality of the SOHs specified in time series for each battery to generate a deterioration regression curve for each battery; a coefficient regression function generation unit configured to generate a regression function of a deterioration coefficient using an average travel distance or an average discharge amount per unit period of the plurality of electrically-driven mobile units as an independent variable and using a deterioration coefficient of the deterioration regression curve of a plurality of the batteries as a dependent variable; a deterioration prediction unit configured to predict a remaining life of a specific battery based on the set SOH to be a life of the battery and a deterioration regression curve of the specific battery; and a reception unit configured to receive a change in travel conditions of the electrically-driven mobile unit in which the battery is mounted, the change being input to a user. The deterioration prediction unit specifies the average travel distance or the average discharge amount per unit period in accordance with the received change in the travel conditions, applies the average travel distance or the average discharge amount per unit period to the regression function of the deterioration coefficient to specify a deterioration coefficient after the change in the travel conditions, and uses the deterioration coefficient to change the deterioration regression curve of the battery mounted in the electrically-driven mobile unit.

Any combinations of the configuration elements described above and modifications of the features of the present disclosure in methods, devices, systems, computer programs, and the like are still effective as aspects of the present disclosure.

According to the present disclosure, it is possible to easily predict deterioration of a battery mounted in an electrically-driven mobile unit.

BRIEF DESCRIPTION OF THE DRAWINGS

FIG. 9 is a flowchart showing a flow of deterioration prediction processing of the battery module by the computing system.

DESCRIPTION OF EMBODIMENT

Figure 1:
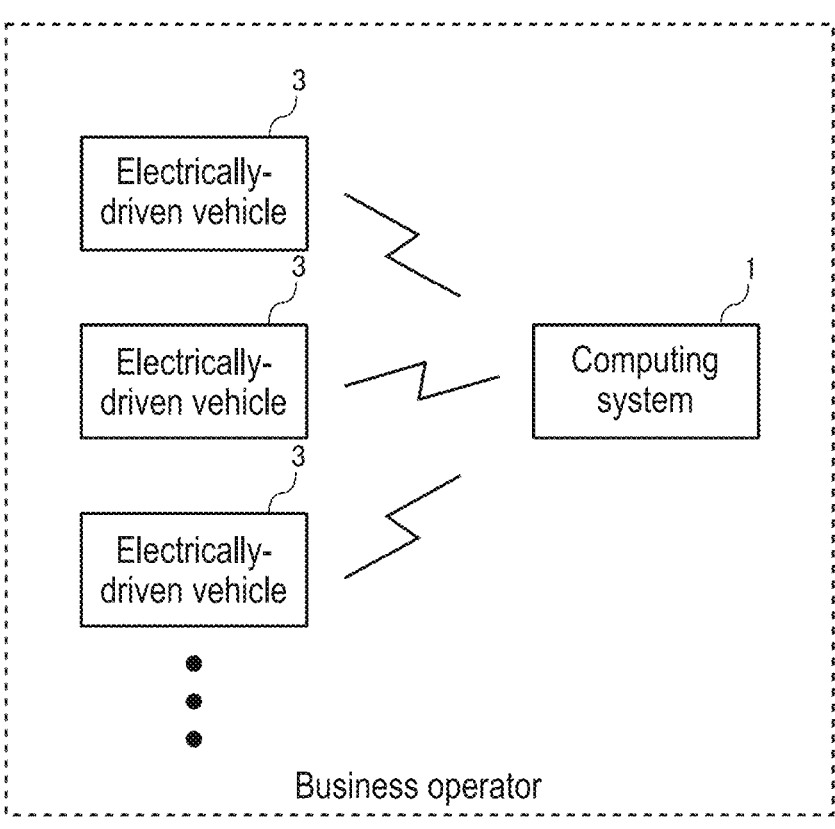
FIG. 1 is a diagram illustrating a computing system used by a business operator according to an exemplary embodiment.

FIG. 1 is a diagram illustrating computing system 1 used by a business operator according to an exemplary embodiment. The business operator has a plurality of electrically-driven vehicles 3 and runs a business using the plurality of electrically-driven vehicles 3. For example, the business operator uses the plurality of electrically-driven vehicles 3 to run a delivery business (home delivery business), a taxi business, a rental car business, or a car sharing business. In the present exemplary embodiment, a pure EV without an engine is assumed as electrically-driven vehicle 3.

Computing system 1 is a system configured to manage business of a business operator. Computing system 1 is constituted of one or a plurality of information processing devices (for example, servers and personal computers (PCs)). A part or all of the information processing devices which constitute computing system 1 may be present in a data center. For example, computing system 1 may be constituted by combining a server (own business server, cloud server, or rental server) in the data center and a client PC in the business operator.

The plurality of electrically-driven vehicles 3 are parked in a parking lot or a garage of a business office of the business operator during standby. The plurality of electrically-driven vehicles 3 have a wireless communication function and can perform wireless communication with computing system 1. The plurality of electrically-driven vehicles 3 transmits travel data including operation data of an on-board secondary battery to computing system 1. While traveling, electrically-driven vehicle 3 may wirelessly transmit the travel data to a server constituting computing system 1 via a network. For example, the travel data may be transmitted at a frequency of once every ten seconds. Alternatively, the travel data for one day may be transmitted in batch at a predetermined timing once a day (for example, at the end of business hours).

In addition, in the case where computing system 1 is constituted of an own business server or a PC installed in the business office, electrically-driven vehicle 3 may transmit the travel data for one day to the own business server or the PC after returning to the business office after the end of business hours. In that case, the travel data may be wirelessly transmitted to the own business server or the PC, or may be connected to the own server or the PC by wire and transmitted via wired communication. Alternatively, the travel data may be transmitted to the own business server or the PC via a recording medium in which the travel data is recorded. In the case where computing system 1 includes a combination of a cloud server and the client PC in the business operator, electrically-driven vehicle 3 may transmit the travel data to the cloud server via the client PC in the business operator.

Figure 2:
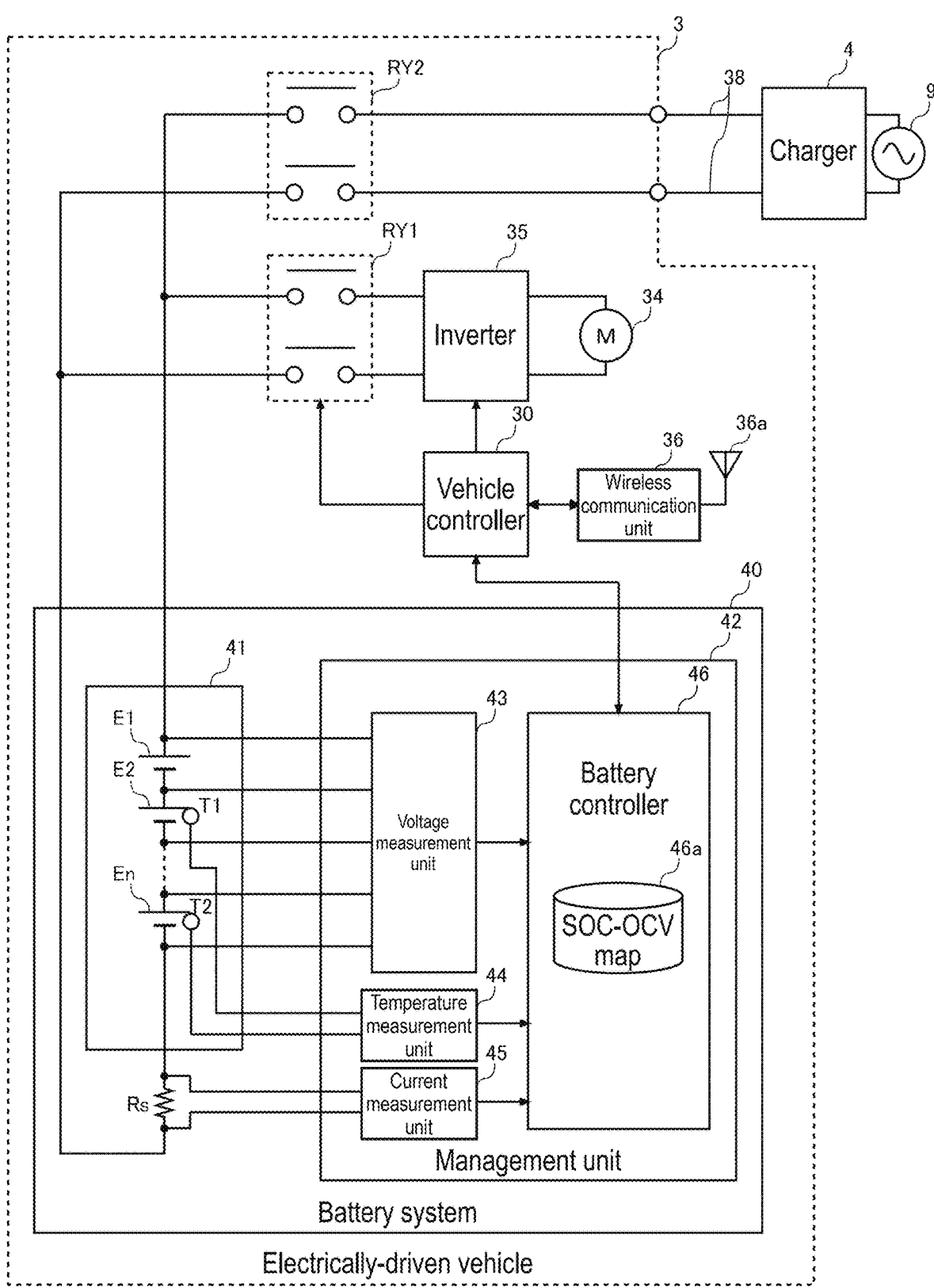
FIG. 2 is a diagram illustrating a detailed configuration of a battery system mounted in an electrically-driven vehicle.

FIG. 2 is a diagram illustrating a detailed configuration of battery system 40 mounted in electrically-driven vehicle 3. Battery system 40 is connected to motor 34 through first relay RY1 and inverter 35. Inverter 35 converts DC power supplied from battery system 40 into AC power and supplies the AC power to motor 34 at the time of power running. At the time of regeneration, the AC power supplied from motor 34 is converted into the DC power and supplied to battery system 40. Motor 34 is a three-phase AC motor, and rotates in accordance with the AC power supplied from inverter 35 at the time of power running. At the time of regeneration, rotational energy due to deceleration is converted into the AC power and supplied to inverter 35.

First relay RY1 is a contactor provided in wiring connecting battery system 40 to inverter 35. Vehicle controller 30 controls first relay RY1 in an on-state (closed state) during traveling, and electrically connects battery system 40 to a power system of electrically-driven vehicle 3. Vehicle controller 30 generally controls first relay RY1 in an off-state (open state) during non-traveling, and electrically interrupts battery system 40 from the power system of electrically-driven vehicle 3. Instead of the relay, another type of switch such as a semiconductor switch may be used.

Battery system 40 can be charged from commercial power system 9 by being connected to charger 4 installed outside electrically-driven vehicle 3 with charging cable 38. Charger 4 is connected to commercial power system 9 and charges battery system 40 in electrically-driven vehicle 3 using charging cable 38. In electrically-driven vehicle 3, second relay RY2 is provided in wiring connecting battery system 40 to charger 4. Instead of the relay, another type of switch such as a semiconductor switch may be used. Management unit 42 of battery system 40 controls second relay RY2 in the on-state (closed state) before start of charging, and controls second relay RY2 in the off-state (open state) after the end of charging.

In general, an alternating current is used for normal charging, and a direct current is used for quick charging. In the case of using the alternating current for charging, the AC power is converted into the DC power by an AC/DC converter (not illustrated) interposed between second relay RY2 and battery system 40.

Battery system 40 includes battery module 41 and management unit 42, and battery module 41 includes a plurality of cells E1 to En connected in series. Battery module 41 may be constituted of a plurality of battery modules connected in series or series and parallel. For each of the cells, a lithium-ion battery cell, a nickel metal hydride battery cell, a lead battery cell, or the like can be used. Hereinafter, in the present description, an example in which a lithium ion battery cell (nominal voltage of 3.6 V to 3.7 V) is used is assumed. The number of series connections of cells E1 to En is determined in accordance with drive voltage of motor 34.

Shunt resistor Rs is connected to the plurality of cells E1 to En in series. Shunt resistor Rs functions as a current detection element. Instead of shunt resistor Rs, a hall element may be used. In addition, a plurality of temperature sensors T1 and T2 configured to detect temperature of the plurality of cells E1 to En are installed inside battery module 41. One temperature sensor may be installed in the battery module, or one temperature sensor may be installed in each of the plurality of cells. For example, a thermistor can be used for temperature sensors T1 and T2.

Management unit 42 includes voltage measurement unit 43, temperature measurement unit 44, current measurement unit 45, and battery controller 46. Each of nodes of cells E1 to En connected in series is connected to voltage measurement unit 43 with corresponding one of a plurality of voltage lines. Voltage measurement unit 43 measures voltage of each of cells E1 to En by measuring voltage between two adjacent voltage lines. Voltage measurement unit 43 transmits the measured voltage of each of cells E1 to En to battery controller 46.

Since voltage measurement unit 43 has a higher voltage than that of battery controller 46, voltage measurement unit 43 and battery controller 46 are connected with a communication line in an insulated state. Voltage measurement unit 43 can be constituted of an application specific integrated circuit (ASIC) or a general-purpose analog front-end integrated circuit (IC). Voltage measurement unit 43 includes a multiplexer and an A/D converter. The multiplexer outputs the voltage between two adjacent voltage lines to the A/D converter in order from the top. The A/D converter converts, into a digital value, an analog voltage to be input from the multiplexer.

Temperature measurement unit 44 includes a voltage dividing resistor and an A/D converter. The A/D converter sequentially converts a plurality of analog voltages divided by the plurality of temperature sensors T1 and T2 and the plurality of voltage dividing resistors into digital values and outputs the digital values to battery controller 46. Battery controller 46 estimates temperatures of the plurality of cells E1 to En based on the digital values. For example, battery controller 46 estimates the temperature of each of cells E1 to En based on a value measured by the temperature sensor closest to the corresponding one of cells E1 to En.

Current measurement unit 45 includes a differential amplifier and an A/D converter. The differential amplifier amplifies voltage across shunt resistor Rs and outputs the voltage to the A/D converter. The A/D converter converts the voltage received from the differential amplifier into a digital value and outputs the digital value to battery controller 46. Battery controller 46 estimates a current flowing through the plurality of cells E1 to En based on the digital value.

Note that in the case where an A/D converter is mounted in battery controller 46 and an analog input port is provided in battery controller 46, temperature measurement unit 44 and current measurement unit 45 may output analog voltages to battery controller 46, and the A/D converter in battery controller 46 may convert the analog voltages into digital values.

Battery controller 46 manages a state of each of the plurality of cells E1 to En based on the voltage, the temperature, and the current of the corresponding one of the plurality of cells E1 to En measured by voltage measurement unit 43, temperature measurement unit 44, and current measurement unit 45, respectively. Battery controller 46 and vehicle controller 30 are connected through an in-vehicle network. For example, a controller area network (CAN) or a local interconnect network (LIN) can be used as the in-vehicle network.

Battery controller 46 can be configured by a microcomputer and a nonvolatile memory (for example, electrically erasable programmable read-only memory (EEPROM) or flash memory). SOC-OCV (Open Circuit Voltage) map 46a is stored in the microcomputer or the non-volatile memory. SOC-OCV map 46a describes characteristic data of SOC-OCV curves of the plurality of cells E1 to En. The SOC-OCV curves of the plurality of cells E1 to En are generated in advance by a battery manufacturer and registered in the microcomputer or the nonvolatile memory at the time of shipment. The battery manufacturer conducts various tests to derive the SOC-OCV curves of cells E1 to En.

Battery controller 46 estimates an SOC, an FCC (Full Charge Capacity), and an SOH of each of the plurality of cells E1 to En. Battery controller 46 estimates the SOC using an OCV method and a current integration or a combination thereof. The OCV method is used to estimate the SOC based on the OCV of each of cells E1 to En measured by voltage measurement unit 43 and the characteristic data of the SOC-OCV curve described in SOC-OCV map 46a. The current integration method is used to estimate the SOC based on the OCV at the start of charging and discharging of each of cells E1 to En and an integrated value of a current measured by current measurement unit 45. In the current integration method, a measurement error of current measurement unit 45 accumulates as the charge and discharge time increases. Thus, the SOC estimated with the current integration method is preferably corrected using the SOC estimated with the OCV method.

Battery controller 46 can estimate the FCC of the cell based on the characteristic data of the SOC-OCV curve described in SOC-OCV map 46a and two OCVs of the cell measured by voltage measurement unit 43.

Figure 3:
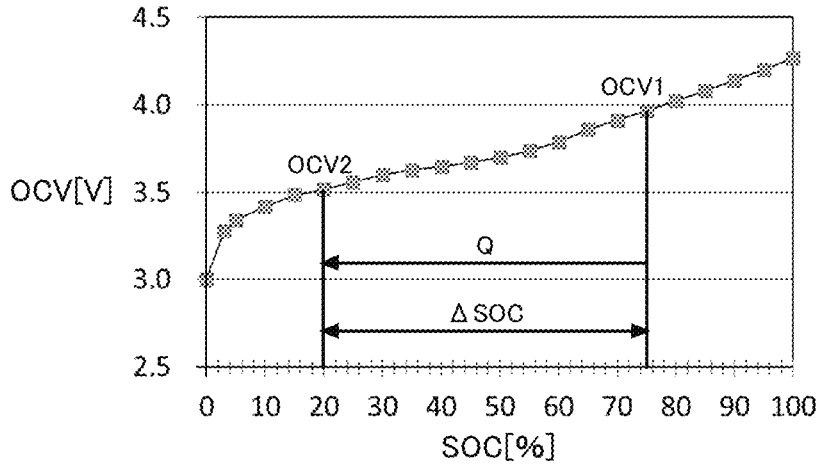
FIG. 3 is a diagram illustrating an estimation method of an FCC.

FIG. 3 is a diagram illustrating an estimation method of the FCC. Battery controller 46 acquires two OCVs of the cell. Battery controller 46 refers to the SOC-OCV curve to identify two SOCs respectively corresponding to two voltages, and calculates a difference $\Delta$SOC between the two SOCs. In the example illustrated in FIG. 3, the two SOCs are 20% and 75%, and the $\Delta$SOC is 55%.

Based on time transition of the current measured by current measurement unit 45, battery controller 46 calculates current integrated amount (=charge and discharge capacity) Q in a period between the two time points at which the two OCVs are acquired. Battery controller 46 can estimate the FCC by calculating the following (Equation 1).

$$FCC = Q/\Delta SOC \qquad \text{(Equation 1)}$$

The SOH is defined as a ratio of the current FCC to the initial FCC, and the lower the value of SOH (closer to 0%) is, the more the deterioration progresses. Battery controller 46 can estimate the SOH by calculating the following (Equation 2).

$$SOH = \text{Current FCC/Initial FCC} \qquad \text{(Equation 2)}$$

The SOH may be obtained by capacity measurement by complete charging and discharging, or may be obtained by adding storage deterioration and cycle deterioration. The storage deterioration can be estimated based on an SOC, a temperature, and a storage deterioration rate. The cycle deterioration can be estimated based on an SOC range to be used, a temperature, a current rate, and a cycle deterioration rate. The storage deterioration rate and the cycle deterioration rate can be derived in advance by experiments or simulations. The SOC, the temperature, the SOC range, and the current rate can be obtained by measurement.

The SOH can also be estimated based on a correlation with an internal resistance of the cell. The internal resistance can be estimated by dividing, by the current value, a voltage drop occurring when a predetermined current flows through the cell for a predetermined time. The internal resistance decreases as the temperature rises, and increases as the SOH decreases.

Battery controller 46 transmits the voltage, the temperature, the current, the SOC, the FCC, and the SOH of the plurality of cells E1 to En to vehicle controller 30 via the in-vehicle network. Vehicle controller 30 generates travel data including battery data and vehicle data. The battery data includes voltages, currents, and temperatures of the plurality of cells E1 to En. Depending on models of battery system 40, the SOC can be included in the battery data in addition to the voltage, the current, and the temperature. Further, some models can include at least one of the FCC and the SOH in addition to the voltage, the current, the temperature, and the SOC. The vehicle data can include an average speed, a travel distance, a travel route, and the like.

Wireless communication unit 36 performs signal processing for wireless connection to a network via antenna 36*a*. In the present exemplary embodiment, wireless communication unit 36 wirelessly transmits the travel data acquired from vehicle controller 30 to computing system 1. Examples of a wireless communication network to which electrically-driven vehicle 3 can be wirelessly connected include a cellular phone network (cellular network), a wireless local area network (LAN), an electronic toll collection system (ETC), dedicated short range communications (DSRC), Vehicle-to-Infrastructure (V2I), and Vehicle-to-Vehicle (V2V).

Figure 4:
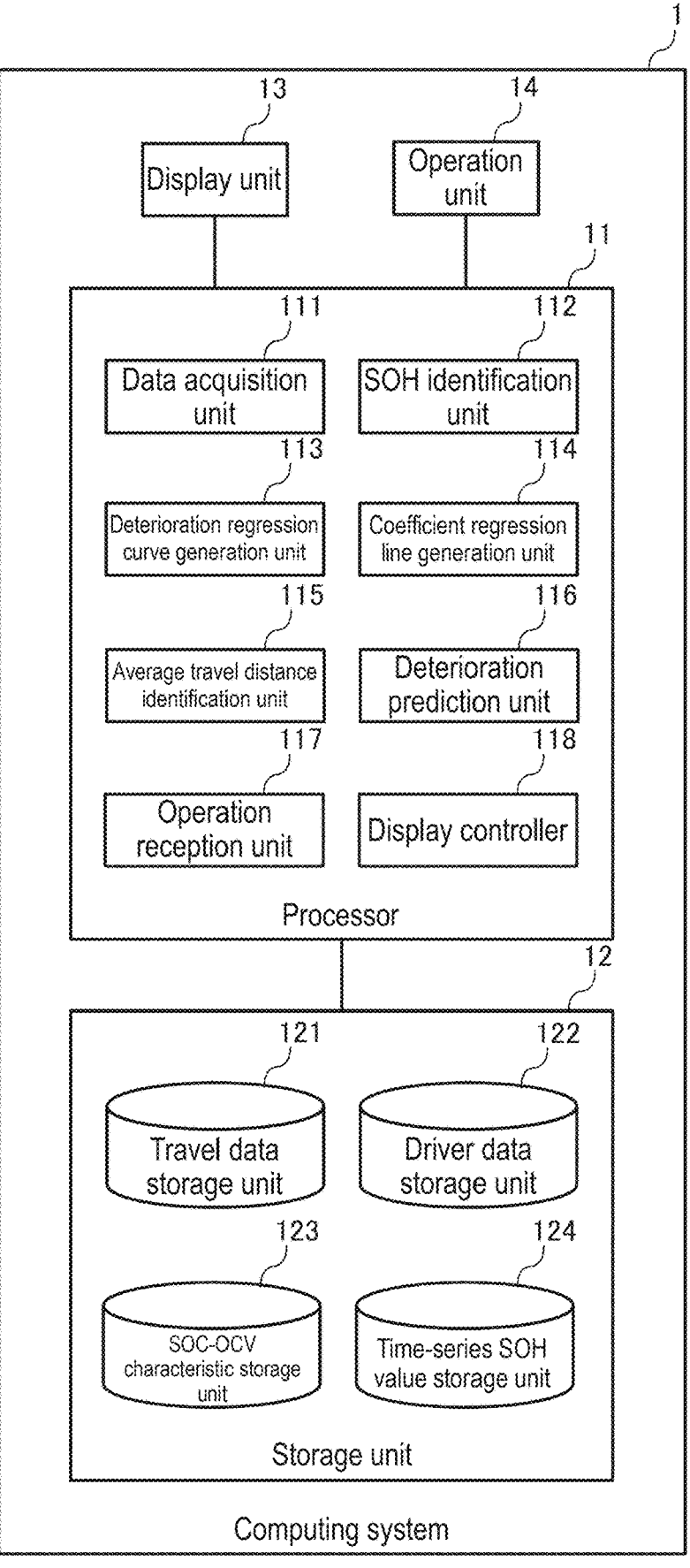
FIG. 4 is a diagram illustrating a configuration example of the computing system according to the exemplary embodiment.

FIG. 4 is a diagram illustrating a configuration example of computing system 1 according to the exemplary embodiment. Computing system 1 includes processor 11, storage unit 12, display unit 13, and operation unit 14. Processor 11 includes data acquisition unit 111, SOH identification unit 112, deterioration regression curve generation unit 113, coefficient regression line generation unit 114, average travel distance identification unit 115, deterioration prediction unit 116, operation reception unit 117, and display controller 118. The function of processor 11 can be implemented by cooperation of a hardware resource and a software resource, or by the hardware resource alone. As the hardware resources, a central processing unit (CPU), a graphics processing unit (GPU), a read only memory (ROM), a random access memory (RAM), an ASIC, a field programmable gate array (FPGA), and other large-scale integrations (LSIs) can be used. As the software resources, programs such as an operating system and an application can be used.

Storage unit 12 includes travel data storage unit 121, driver data storage unit 122, SOC-OCV characteristic storage unit 123, and time-series SOH value storage unit 124. Storage unit 12 includes a nonvolatile recording medium such as a hard disk drive (HDD) and a solid state drive (SSD), and records various types of programs and data.

Travel data storage unit 121 stores travel data collected from the plurality of electrically-driven vehicles 3 owned by the business operator. Driver data storage unit 122 stores data of a plurality of drivers belonging to the business operator. For example, the total travel distance of each electrically-driven vehicle 3 that is driven is managed for each driver.

SOC-OCV characteristic storage unit 123 stores SOC-OCV characteristics of the plurality of battery modules 41 respectively mounted in the plurality of electrically-driven vehicles 3 owned by the business operator. As the SOC-OCV characteristic of battery module 41, one acquired from each electrically-driven vehicle 3 may be used, or one estimated based on the travel data collected from each electrically-driven vehicle 3 may be used.

In the latter case, an SOC-OCV characteristic estimation unit (not illustrated) of processor 11 extracts a set of the SOC and the voltage ($\approx$OCV) in the period during which battery module 41 can be regarded as being in a resting state from a set of the SOC and the voltage at the plurality of times included in the acquired battery data, and approximates the SOC-OCV characteristic based on the plurality of extracted sets of the SOC and the OCV. The SOC-OCV characteristic estimation unit may generate common SOC-OCV characteristic of battery module 41 of the same type based on data of the set of the SOC and the OCV acquired from the plurality of electrically-driven vehicles 3 in which battery modules 41 of the same type are respectively mounted. The SOC-OCV characteristic may be stored in units of cells.

Time-series SOH value storage unit 124 stores time-series data of the SOH for each battery module 41. The time-series data of the SOH is recorded, for example, at a frequency of once a day, once every few days, or once a week.

Display unit 13 includes a display such as a liquid crystal display or an organic EL display, and displays an image generated by processor 11. Operation unit 14 is a user interface such as a keyboard, a mouse, and a touch panel, and accepts user's operations in computing system 1.

Data acquisition unit 111 acquires travel data including battery data of battery module 41 mounted in each of the plurality of electrically-driven vehicle 3, and stores the acquired travel data in travel data storage unit 121. SOH identification unit 112 identifies the SOH of battery module 41 mounted in each electrically-driven vehicle 3 based on the battery data included in the travel data acquired by data acquisition unit 111. SOH identification unit 112 stores the identified SOH in time-series SOH value storage unit 124.

When the acquired battery data includes the SOH, SOH identification unit 112 can use the acquired SOH as it is. When the acquired battery data does not include the SOH but includes the voltage, the current, the temperature, and the SOC, the SOH can be calculated based on (Equation 1) and (Equation 2). That is, based on time transition of the current included in the battery data, SOH identification unit 112 calculates the current integration amount Q in the period between the two time points at which the two OCVs are acquired, and applies the calculated current integration amount Q to (Equation 1), thereby estimating the FCC. SOH identification unit 112 calculates the SOH by applying the calculated FCC to (Equation 2).

When neither the SOC nor the SOH is included in the acquired battery data, SOH identification unit 112 applies the voltage ($\approx$OCV) in the period during which battery module 41 can be regarded as being in the resting state to the SOC-OCV characteristic, thereby estimating the SOC. Alternatively, SOH identification unit 112 estimates the SOC by integrating the current values in a certain period. By using the estimated SOC, SOH identification unit 112 calculates the SOH similarly to the case in which the SOC is included in the battery data.

Deterioration regression curve generation unit 113 generates a deterioration regression curve of each battery module 41 by performing curve regression on a plurality of SOHs identified in time series for each battery module 41. For example, a least squares method can be used for the curve regression.

Figure 5:
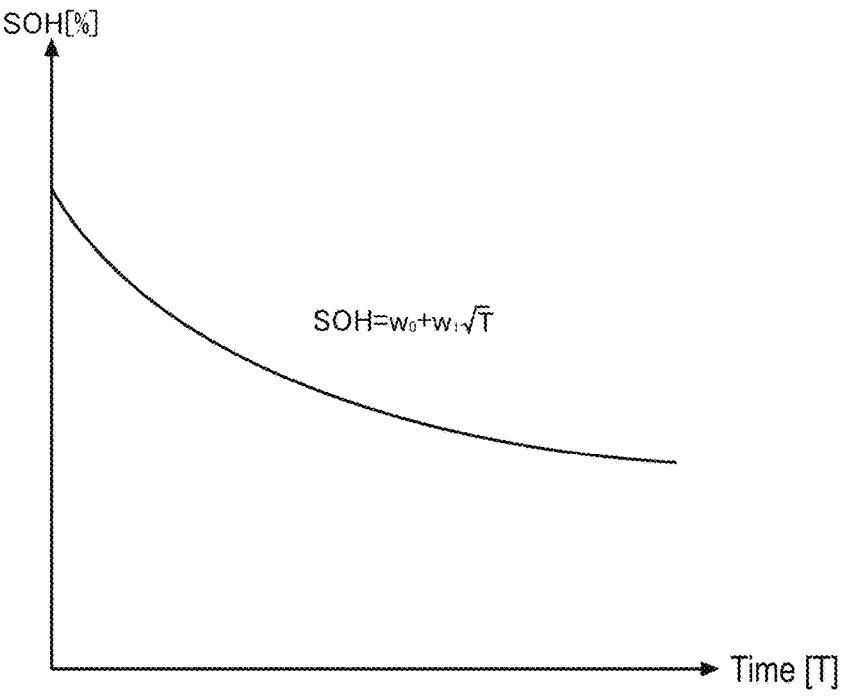
FIG. 5 is a graph showing a deterioration curve of a secondary battery.

FIG. 5 is a graph showing a deterioration curve of the secondary battery. It is known that the deterioration of the secondary battery progresses in proportion to the square root of time (0.5 power law), as shown in the following (Equation 3).

$$\text{SOH} = w_0 + w_1 \sqrt{t} \qquad \text{(Equation 3)}$$

$w_0$ is an initial value, and $w_1$ is a deterioration coefficient. Deterioration regression curve generation unit 113 obtains deterioration coefficient $w_1$ of (Equation 3) by exponential curve regression to the power of 0.5 with the time t as an independent variable and the SOH as a dependent variable. $w_0$ is common and is usually set to a range from 1.0 to 1.1. When an actual initial capacity and a nominal value match, $w_0 = 1.0$ is set, and when the nominal value is set to the minimum guaranteed amount and is set to be lower than the actual initial capacity, $w_0$ is set to a value greater than 1.0.

Coefficient regression line generation unit 114 generates a regression line having the average travel distance per unit period of the plurality of electrically-driven vehicles 3 as an independent variable and having deterioration coefficient $w_1$ of the deterioration regression curve of each of the plurality of battery modules 41 as a dependent variable. For example, a least squares method can be used for linear regression. Hereinafter, an average travel distance per day is assumed as the average travel distance per unit period.

When the average travel distance per day of each electrically-driven vehicle 3 is recorded in travel data storage unit 121, average travel distance identification unit 115 can use the average travel distance recorded in travel data storage unit 121. When the average travel distance per day of each electrically-driven vehicle 3 is not recorded in travel data storage unit 121, data acquisition unit 111 acquires a cumulative travel distance from each electrically-driven vehicle 3. Average travel distance identification unit 115 calculates the average travel distance per day of each electrically-driven vehicle 3 by dividing the acquired cumulative travel distance of each electrically-driven vehicle 3 by the number of days from the start date of use of each electrically-driven vehicle 3.

Figure 6:
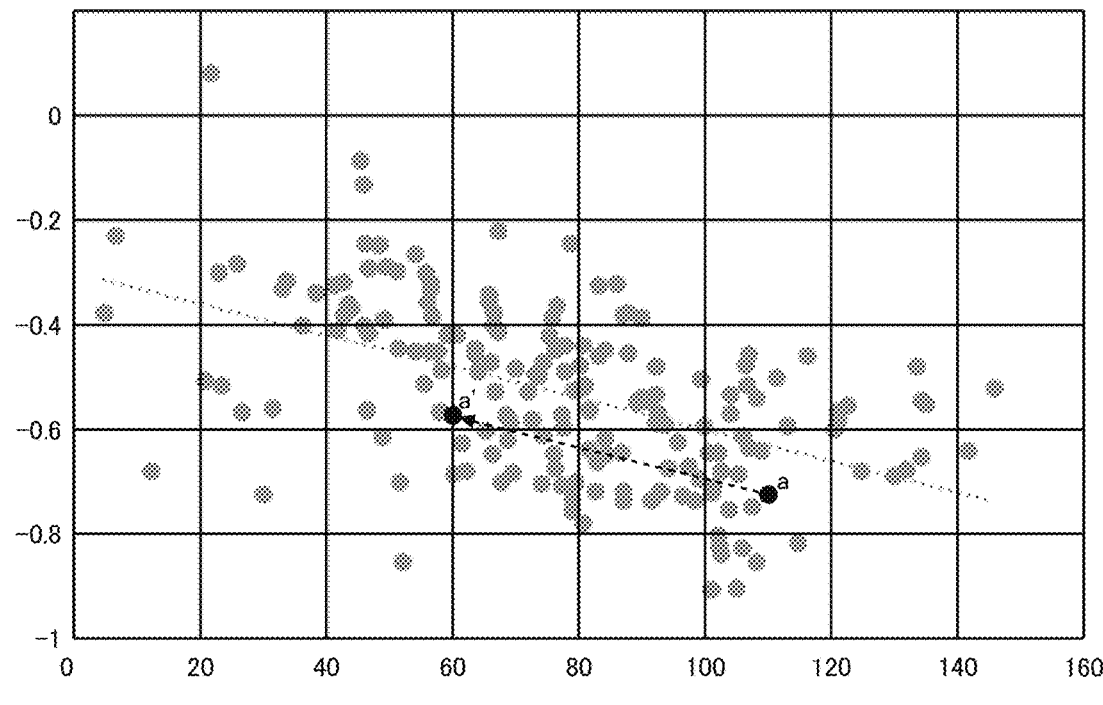
FIG. 6 is a diagram illustrating an example of a regression line having an average travel distance per day as an independent variable and having a deterioration coefficient of a deterioration curve of a battery module as a dependent variable.

FIG. 6 is a diagram illustrating an example of a regression line having the average travel distance per day as an independent variable and having deterioration coefficient $w_1$ of the deterioration curve of battery module 41 as a dependent variable. In the example illustrated in FIG. 6, a regression line illustrated in the following (Equation 4) is generated.

$$y = -0.003x - 0.2981 \qquad \text{(Equation 4)}$$

Deterioration prediction unit 116 predicts a remaining life of battery module 41 based on the deterioration regression curve of battery module 41 generated by deterioration regression curve generation unit 113 and the SOH to be the remaining life of battery module 41. The SOH to be the remaining life of battery module 41 is preset by a battery manufacturer. For example, the SOH may be set to 70%. A user can change the setting of the SOH to be the remaining life of battery module 41 using operation unit 14.

Operation reception unit 117 receives a deterioration prediction request of specific battery module 41 input to the user. Deterioration prediction unit 116 generates the deterioration regression curve of designated battery module 41 and predicts the remaining life of battery module 41. Display controller 118 causes display unit 13 to display the predicted remaining life of battery module 41.

Display controller 118 can display the remaining life of battery module 41 as a remaining usable period (for example, the number of remaining usable days) of battery module 41. When electrically-driven vehicle 3 is assumed to be used every day, display controller 118 can also display the remaining life of battery module 41 as a use end date of battery module 41 (XX (month) XX (day), 20xx (year)). Display controller 118 can also display the remaining life of battery module 41 as a remaining travelable distance of electrically-driven vehicle 3 in which battery module 41 is mounted. The remaining travelable distance of electrically-driven vehicle 3 can be calculated by multiplying the number of remaining usable days of battery module 41 mounted in electrically-driven vehicle 3 by the average travel distance per day of electrically-driven vehicle 3. Note that, since the calculated use end date, the number of remaining usable days, and the remaining travelable distance are predicted results, display controller 118 may display the predicted results with a width of about ±10% on display unit 13 and present the predicted results to the user.

The above description is a description of a case in which there is no change in the average travel distance per day of electrically-driven vehicle 3. The user can change a travel condition of electrically-driven vehicle 3 in which battery module 41, the remaining life of which is desired to be predicted, is mounted using operation unit 14.

Operation reception unit 117 receives a change in the travel condition of electrically-driven vehicle 3 in which specific battery module 41 is mounted, the change being input to the user. For example, operation reception unit 117 receives a change in the average travel distance per day of electrically-driven vehicle 3. Deterioration prediction unit 116 applies the received average travel distance per day to a coefficient regression line generated by coefficient regression line generation unit 114. As a result, deterioration coefficient $w_1$ after the change in the average travel distance can be obtained. Deterioration prediction unit 116 changes the deterioration regression curve of battery module 41 mounted in electrically-driven vehicle 3 using obtained deterioration coefficient $w_1$.

Figure 7:
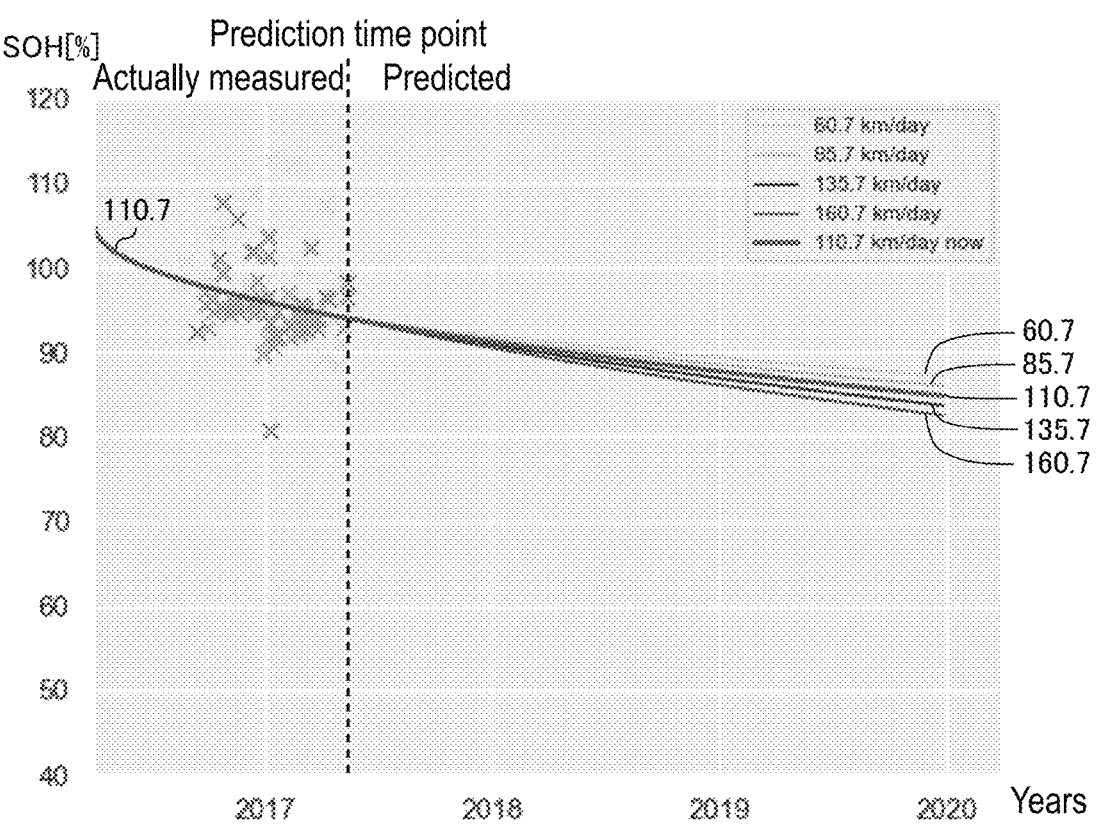
FIG. 7 is a diagram illustrating a specific example of processing of changing a deterioration regression curve of a specific battery module.

FIG. 7 is a diagram illustrating a specific example of processing of changing the deterioration regression curve of specific battery module 41. Deterioration regression curve generation unit 113 generates the deterioration regression curve of battery module 41 based on the SOH of battery module 41 at a plurality of time points in the past from a prediction time point. Note that $w_0$ of the deterioration regression curve (SOH=$w_0$+$w_1\sqrt{t}$) illustrated in FIG. 7 is set to 1.05. This indicates that the actual initial capacity of battery module 41 is larger than the nominal value.

Average travel distance identification unit 115 acquires an average travel distance for each day of electrically-driven vehicle 3 in which battery module 41 is mounted from travel data storage unit 121. Average travel distance identification unit 115 calculates the average travel distance per day by summing the average travel distances for each day and dividing the summed distance by the number of use days. When average travel distance identification unit 115 cannot acquire the average travel distance for each day of electrically-driven vehicle 3, average travel distance identification unit 115 acquires a cumulative travel distance of electrically-driven vehicle 3 and divides the cumulative travel distance by the number of use days, thereby calculating the average travel distance per day. In the example illustrated in FIG. 7, the average travel distance per day of electrically-driven vehicle 3 is 110.7 km/day.

Figure 8A:
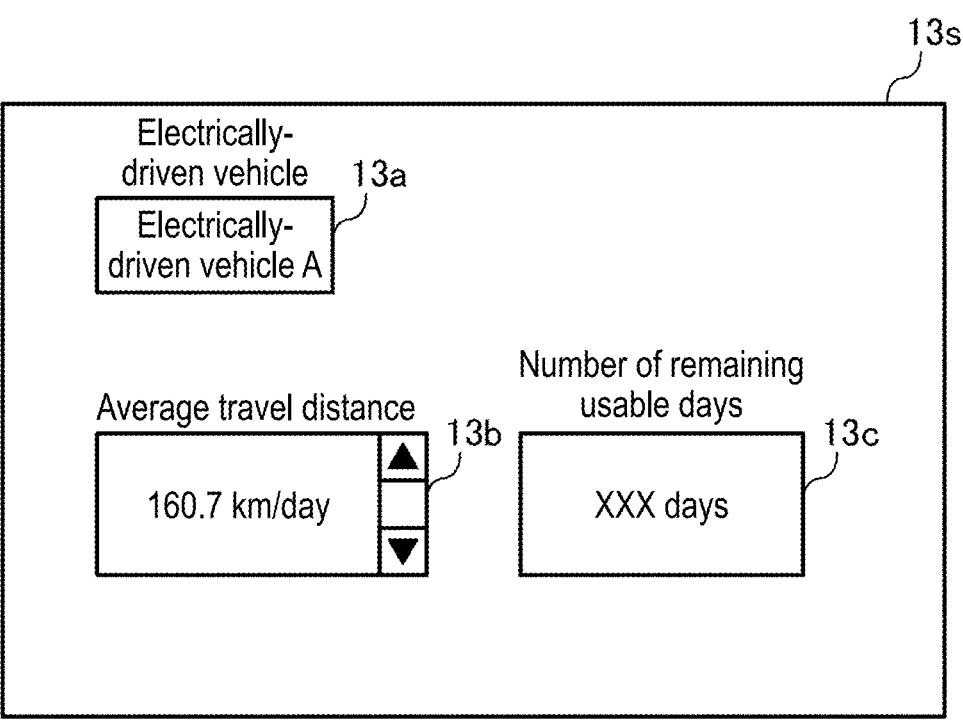
FIG. 8A is a diagram illustrating an example of a deterioration prediction simulation screen displayed on a display unit.
Figure 8B:
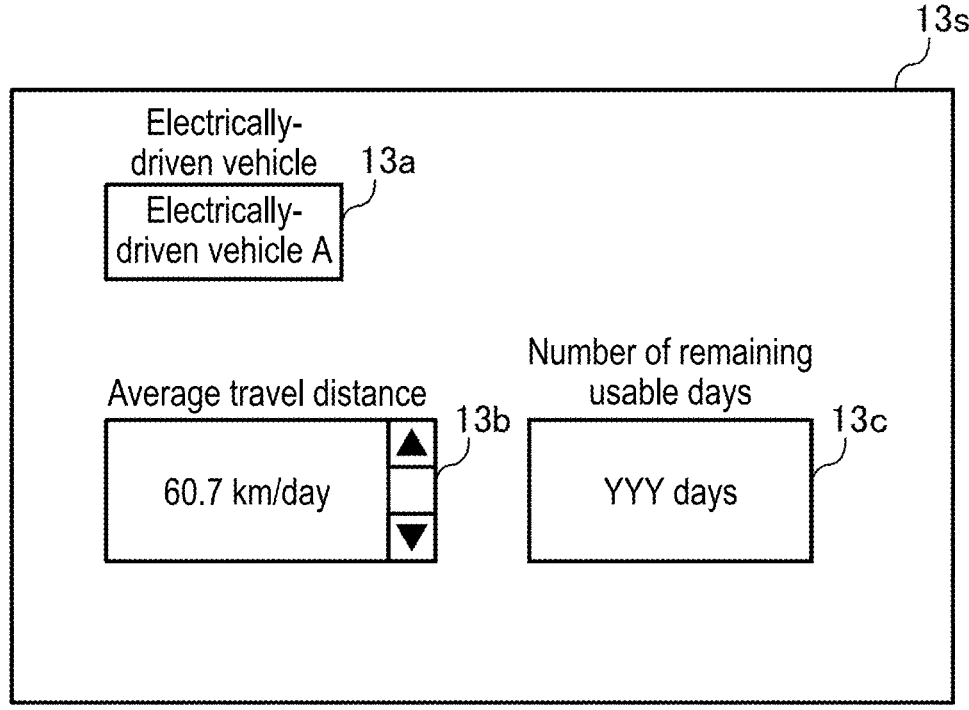
FIG. 8B is a diagram illustrating an example of the deterioration prediction simulation screen displayed on the display unit.

FIGS. 8A and 8B are diagrams illustrating an example of deterioration prediction simulation screen 13s displayed on display unit 13. Deterioration prediction simulation screen 13s illustrated in FIGS. 8A and 8B includes vehicle selection field 13a, average travel distance field 13b, and number of remaining usable days field 13c.

The user selects electrically-driven vehicle 3 on which a deterioration prediction simulation is to be performed from vehicle selection field 13a. Deterioration regression curve generation unit 113 generates a deterioration regression curve of battery module 41 mounted in selected electrically-driven vehicle 3. Deterioration prediction unit 116 predicts the number of remaining usable days of battery module 41 based on the generated deterioration regression curve of battery module 41. Average travel distance identification unit 115 identifies an average travel distance of selected electrically-driven vehicle 3.

As illustrated in FIG. 8A, display controller 118 displays the average travel distance of selected electrically-driven vehicle 3 in average travel distance field 13b. Display controller 118 displays the predicted number of remaining usable days of battery module 41 in number of remaining usable days field 13c.

The user can change the average travel distance of selected electrically-driven vehicle 3. Deterioration prediction simulation screen 13s illustrated in FIG. 8B illustrates a state in which the average travel distance is changed to 60.7 km/day. Deterioration prediction unit 116 applies the changed average travel distance to the coefficient regression line, thereby obtaining deterioration coefficient $w_1$ after the change in the average travel distance. When the average travel distance is changed from 110.7 km/day to 60.7 km/day, deterioration coefficient $w_1$ moves from point a to point a' as illustrated in FIG. 6. The transition from point a to point a' uses the slope of the coefficient regression line. Deterioration coefficient w1 corresponding to point a' is obtained by multiplying deterioration coefficient w1 of point a by the change in the average travel distance (−50 km/day in the case of 110.7 km/day→60.7 km/day) as the slope of the regression line.

Deterioration prediction unit 116 superimposes a deterioration regression curve before the change in the average travel distance and a deterioration regression curve after the change in the average travel distance at a position where the SOHs at a prediction time point match. After the prediction time point, deterioration prediction unit 116 predicts deterioration according to the deterioration regression curve after the change in the average travel distance. In FIG. 7, five deterioration regression curves are drawn in a case where the average travel distance is 110.7 km/day, in a case where the average travel distance is changed to 60.7 km/day, in a case where the average travel distance is changed to 85.7 km/day, in a case where the average travel distance is changed to 135.7 km/day, and in a case where the average travel distance is changed to 160.7 km/day. It can be seen that as the average travel distance is changed to be shorter, the deterioration regression curve becomes gentler, and the life of battery module 41 is extended.

Deterioration prediction unit 116 predicts the number of remaining usable days of battery module 41 based on the deterioration regression curve after the change in the average travel distance. Display controller 118 displays the predicted number of remaining usable days of battery module 41 in number of remaining usable days field 13c.

The user can utilize a deterioration prediction simulation result for prediction of replacement time of electrically-driven vehicle 3 and operation management of the plurality of electrically-driven vehicles 3. For example, in the case of a bus business operator, an operation route of electrically-driven vehicle 3 having a short number of remaining usable days is changed to an operation route with a short travel distance, and an operation route of electrically-driven vehicle 3 having a long number of remaining usable days is changed to an operation route with a long travel distance, thereby making it possible to align the replacement timings of the plurality of electrically-driven vehicles 3.

FIG. 9 is a flowchart showing a flow of deterioration prediction processing of battery module 41 by computing system 1. SOH identification unit 112 identifies an SOH of battery module 41 mounted in each electrically-driven vehicle 3 based on battery data included in travel data acquired from each electrically-driven vehicle 3 (S10). Deterioration regression curve generation unit 113 generates a deterioration regression curve of each battery module 41 based on the time-series SOH of each battery module 41 (S11). Coefficient regression line generation unit 114 generates a regression line of deterioration coefficient $w_1$ based on an average travel distance of the plurality of electrically-driven vehicles 3 and deterioration coefficients $w_1$ of deterioration curves of the plurality of battery modules 41 (S12).

Deterioration prediction unit 116 calculates the number of remaining usable days of battery module 41 from the deterioration regression curve of battery module 41 mounted in electrically-driven vehicle 3 designated by a user (S13). Display controller 118 causes display unit 13 to display the average travel distance of electrically-driven vehicle 3 identified by average travel distance identification unit 115 and the number of remaining usable days of battery module 41 mounted in electrically-driven vehicle 3 (S14).

When a deterioration prediction simulation is being continued (N in S15), operation reception unit 117 can receive a change in the average travel distance of electrically-driven vehicle 3 from the user (S16). Deterioration prediction unit 116 applies the received average travel distance to the regression line of deterioration coefficient $w_1$ to calculate new deterioration coefficient $w_1$ (S17). The processing proceeds to step S13. Deterioration prediction unit 116 calculates the number of remaining usable days of battery module 41 from the deterioration regression curve after the change in deterioration coefficient $w_1$ (S13). Display controller 118 causes display unit 13 to display the changed average travel distance and the number of remaining usable days (S14).

The processing in steps S14 to S17 is repeatedly executed (N in S15) until the deterioration prediction simulation is completed (Y in S15).

In the above-described exemplary embodiment, coefficient regression line generation unit 114 generates the regression line of deterioration coefficient $w_1$ with an average travel distance per day as an independent variable. In this regard, coefficient regression line generation unit 114 may generate the regression line of deterioration coefficient $w_1$ with an average discharge amount per day as an independent variable. When the discharge history of battery module 41 is recorded in travel data storage unit 121, the average discharge amount may be used instead of the average travel distance. When a past cumulative discharge amount can be acquired as the battery data, the average discharge amount per day can be calculated by dividing the cumulative discharge amount by the number of days from the start date of use of electrically-driven vehicle 3.

When the regression line of deterioration coefficient $w_1$ is generated with the average discharge amount per day as an independent variable, deterioration prediction unit 116 converts the average travel distance per day received by operation reception unit 117 into the average discharge amount per unit period based on the electricity consumption [km/Wh] of electrically-driven vehicle 3. Deterioration prediction unit 116 can obtain changed deterioration coefficient $w_1$ by applying the converted average discharge amount to regression line of deterioration coefficient $w_1$.

As described above, according to the present exemplary embodiment, the regression function of deterioration coefficient $w_1$ is generated based on deterioration coefficients $w_1$ of the deterioration curves of the plurality of battery modules 41 mounted in the plurality of electrically-driven vehicles 3, thereby making it possible to easily perform the deterioration prediction of battery module 41 mounted in electrically-driven vehicle 3. For example, it is possible to easily estimate a change in the remaining life when a travel condition is changed.

In addition, in the present exemplary embodiment, the regression function of deterioration coefficient $w_1$ is generated using the cumulatively recorded travel distance of electrically-driven vehicle 3. Deterioration prediction can be intuitively performed using the travel distance that is easy for a manager of electrically-driven vehicle 3 to understand and handle as a parameter. The travel distance of electrically-driven vehicle 3 which is cumulatively recorded is robust against data loss due to communication failure, human work error, or the like, and the average travel distance per unit period can be calculated even when the data section is skipped. That is, even when the travel data of electrically-driven vehicle 3 remains only in pieces, it is possible to perform highly accurate deterioration prediction.

As described above, the past travel data is used when the deterioration prediction of electrically-driven vehicle 3 is performed, but actually, sufficient travel data does not often remain as log data. There may be a case where data for several months is missing or an abnormal value is included. In addition, although an item of the cumulative travel distance exists in the log data of electrically-driven vehicle 3, an item of the cumulative discharge amount may not exist in the battery-related log data, and only an instantaneous value at the time of charging and discharging may exist as an item to be recorded for a short period.

In such a case, it is effective to use the cumulative travel distance, and even with log data including missing data for several months, a travel start date can be estimated from a change amount (travel distance per day) of the cumulative travel distance, and deterioration prediction can be performed based on the travel start date.

Although electricity consumption can be calculated from a relationship between a travel distance and a charge-and-discharge current value, a calculation result of the electricity consumption may become unstable when the data includes an abnormal value. On the other hand, the travel distance is considered as an alternative parameter for a discharge power amount, but is a general item as the travel data of electrically-driven vehicle 3, and is a monotonically increasing cumulative value, such that it is also easy to detect the abnormal value. As described above, the travel distance can be said to be a robust parameter for performing deterioration prediction.

In addition, since the deterioration prediction according to the present exemplary embodiment is not a model for obtaining a deterioration coefficient for each category of the plurality of use conditions of battery module 41, the deterioration prediction can be performed by simple calculation. In battery module 41 mounted in electrically-driven vehicle 3, current may irregularly significantly change in a short time, and thus it is often difficult to obtain the deterioration coefficient for each of the plurality of categories. In addition, the user does not need to input conditions other than the travel distance, and the operation is easy.

The present disclosure has been described above based on the exemplary embodiment. It is to be understood by the person of ordinary skill in the art that the exemplary embodiment is an example, that combinations of its configuration elements and processing processes can have various modified examples, and that such modified examples are also within the scope of the present disclosure.

In the exemplary embodiment described above, the regression function of deterioration coefficient $w_1$ is generated with the travel distance per day as an explanatory variable. In this regard, the regression function of deterioration coefficient $w_1$ may be generated by multiple regression analysis using a plurality of parameters including a temperature, a charging current rate, and the like as explanatory variables in addition to the travel distance per day. In this case, estimation accuracy of deterioration coefficient $w_1$ can be further improved.

As one item of the deterioration prediction of battery module 41, occurrence of the rapid deterioration (hereinafter, referred to as rapid deterioration or tertiary deterioration) of the capacity of battery module 41 may be predicted.

When a usage method that places a heavy burden on battery module 41, such as charging and discharging in a low-temperature or high-temperature environment or charging and discharging at a high rate, is repeatedly performed, rapid deterioration is likely to occur. When the rapid deterioration occurs, battery module 41 is basically unusable, and as such, the life of battery module 41 is shortened. The main factor of the rapid deterioration is the decrease in an electrolyte solution, but it is necessary to disassemble battery module 41 in order to directly measure the amount of the electrolyte solution. However, it is not realistic to disassemble battery module 41 during use of battery module 41. Therefore, an AC signal of a frequency band (for example, 100 Hz to 10 kHz) in which the electrolyte solution reacts is applied from the outside of battery module 41, and an AC impedance value of battery module 41 is measured. Alternatively, the AC impedance value of battery module 41 is estimated by measuring a transient response when battery module 41 starts charging and discharging or stops charging and discharging. Deterioration prediction unit 116 predicts a period until the rapid deterioration of battery module 41 occurs, based on the measured or estimated AC impedance value. When it is predicted that the rapid deterioration occurs in battery module 41 mounted in designated electrically-driven vehicle 3, display controller 118 displays the number of days until the rapid deterioration occurs as the remaining life of battery module 41.

The above-described exemplary embodiment assumes an example in which the deterioration prediction of battery module 41 mounted in electrically-driven vehicle 3 is performed. In this regard, electrically-driven vehicle 3 may be a two-wheeled electric motorcycle (electric scooter) or an electric bicycle. Electrically-driven vehicle 3 also includes low-speed electrically-driven vehicle 3 such as a golf cart and a land car used in a shopping mall or an entertainment facility. The target in which battery module 41 is mounted is not limited to electrically-driven vehicle 3. For example, electrically-driven mobile units such as an electrically-driven ship, a railway vehicle, and a multi-copter (drone) are also included.

The exemplary embodiment may be identified by the following items.

[Item 1]

Computing system (1) including: data acquisition unit (111) configured to acquire travel data including data of battery (E1, 41) mounted in each of a plurality of electrically-driven mobile units (3); SOH identification unit (112) configured to identified an SOH (State Of Health) of battery (E1, 41) mounted in each of the plurality of electrically-driven mobile units (3) based on the battery data included in the acquired travel data; deterioration regression curve generation unit (113) configured to perform curve regression on a plurality of the SOHs identified in time series for each battery (E1, 41) to generate a deterioration regression curve for each battery (E1, 41); coefficient regression function generation unit (114) configured to generate a regression function of a deterioration coefficient using an average travel distance or an average discharge amount per unit period of the plurality of electrically-driven mobile units (3) as an independent variable and using a deterioration coefficient of the deterioration regression curve of a plurality of batteries (E1, 41) as a dependent variable; deterioration prediction unit (116) configured to predict a remaining life of specific battery (E1, 41) based on the set SOH to be a life of battery (E1, 41) and a deterioration regression curve of specific battery (E1, 41); and reception unit (117) configured to receive a change in travel conditions of electrically-driven mobile unit (3) in which battery (E1, 41) is mounted, the change being input to a user, wherein deterioration prediction unit (116) identifies the average travel distance or the average discharge amount per unit period in accordance with the received change in the travel conditions, applies the average travel distance or the average discharge amount per unit period to the regression function of the deterioration coefficient to identify a deterioration coefficient after the change in the travel conditions, and uses the deterioration coefficient to change the deterioration regression curve of battery (E1, 41) mounted in electrically-driven mobile unit (3).

Battery (E1, 41) may be cell E1 or module 41.

According to this configuration, it is possible to easily perform deterioration prediction of battery (E1, 41) mounted in electrically-driven mobile unit (3).

[Item 2]

Computing system (1) according to Item 1, further including average travel distance identification unit (115) configured to calculate the average travel distance per unit period of each electrically-driven mobile unit (3) based on a cumulative travel distance acquired from each electrically-driven mobile unit (3) and a period of service of each electrically-driven mobile unit (3).

According to this configuration, it is possible to construct a highly versatile system by calculating an average travel distance from a cumulative travel distance that is easily acquired as data and regressing a deterioration coefficient based on the average travel distance.

[Item 3]

Computing system (1) according to Item 1, wherein coefficient regression function generation unit (114) generates the regression function of the deterioration coefficient using the average discharge amount per unit period of the plurality of electrically-driven mobile units (3) as an independent variable and using the deterioration coefficient of the deterioration regression curve of each of the plurality of batteries (E1, 41) as a dependent variable, reception unit (117) receives a change in the average travel distance per unit period of electrically-driven mobile unit (3) in which battery (E1, 41) is mounted, and deterioration prediction unit (116) converts the received average travel distance per unit period into the average discharge amount per unit period based on electricity consumption of electrically-driven mobile unit (3).

According to this configuration, even when an average discharge amount is used as a parameter for regression of a deterioration coefficient and an average travel distance is used as a parameter for changing conditions by a user, deterioration prediction can be appropriately performed.

[Item 4]

Computing system (1) according to any one of Items 1 to 3, wherein deterioration prediction unit (116) calculates, as a remaining life of battery (E1, 41), at least one of a remaining usable period of battery (E1, 41) and a remaining travelable distance of electrically-driven mobile unit (3) in which battery (E1, 41) is mounted based on a deterioration regression curve after a change in battery (E1, 41), and displays the calculated one on a display unit.

According to this configuration, it is possible to construct a user interface that is easy for a user to understand.

[Item 5]

A battery (E1, 41) deterioration predicting method including: acquiring travel data including data of battery (E1, 41) mounted in each of a plurality of electrically-driven mobile units (3); identifying an SOH (State Of Health) of battery (E1, 41) mounted in each of the plurality of electrically-driven mobile units (3) based on the battery data included in the acquired travel data; performing curve regression on a plurality of the SOHs identified in time series for each battery (E1, 41) to generate a deterioration regression curve for each battery (E1, 41); generating a regression function of a deterioration coefficient using an average travel distance or an average discharge amount per unit period of the plurality of electrically-driven mobile units (3) as an independent variable and using a deterioration coefficient of the deterioration regression curve of a plurality of batteries (E1, 41) as a dependent variable; predicting a remaining life of battery (E1, 41) based on the set SOH to be a life of specific battery (E1, 41) and a deterioration regression curve of specific battery (E1, 41); receiving a change in travel conditions of electrically-driven mobile unit (3) in which battery (E1, 41) is mounted, the change being input to a user; and identifying the average travel distance or the average discharge amount per unit period in accordance with the received change in the travel conditions, applying the average travel distance or the average discharge amount per unit period to the regression function of the deterioration coefficient to identify a deterioration coefficient after the change in the travel conditions, and using the deterioration coefficient to change the deterioration regression curve of battery (E1, 41) mounted in electrically-driven mobile unit (3).

According to this configuration, it is possible to easily perform deterioration prediction of battery (E1, 41) mounted in electrically-driven mobile unit (3).

[Item 6]

A battery (E1, 41) deterioration predicting program configured to cause a computer to execute processing of: acquiring travel data including data of battery (E1, 41) mounted in each of a plurality of electrically-driven mobile units (3); identifying an SOH (State Of Health) of battery (E1, 41) mounted in each of the plurality of electrically-driven mobile units (3) based on the battery data included in the acquired travel data; performing curve regression on a plurality of the SOHs identified in time series for each battery (E1, 41) to generate a deterioration regression curve for each battery (E1, 41); generating a regression function of a deterioration coefficient using an average travel distance or an average discharge amount per unit period of the plurality of electrically-driven mobile units (3) as an independent variable and using a deterioration coefficient of the deterioration regression curve of a plurality of batteries (E1, 41) as a dependent variable; predicting a remaining life of specific battery (E1, 41) based on the set SOH to be a life of battery (E1, 41) and a deterioration regression curve of specific battery (E1, 41); receiving a change in travel conditions of electrically-driven mobile unit (3) in which battery (E1, 41) is mounted, the change being input to a user; and identifying the average travel distance or the average discharge amount per unit period in accordance with the received change in the travel conditions, applying the average travel distance or the average discharge amount per unit period to the regression function of the deterioration coefficient to identify a deterioration coefficient after the change in the travel conditions, and using the deterioration coefficient to change the deterioration regression curve of battery (E1, 41) mounted in electrically-driven mobile unit (3).

According to this configuration, it is possible to easily perform deterioration prediction of battery (E1, 41) mounted in electrically-driven mobile unit (3).

REFERENCE MARKS IN THE DRAWINGS

1: computing system
E1-En: cell
T1, T2: temperature sensor
RY1, RY2: relay
3: electrically-driven vehicle
4: charger
11: processor
111: data acquisition unit
112: SOH identification unit
113: deterioration regression curve generation unit
114: coefficient regression line generation unit
115: average travel distance identification unit
116: deterioration prediction unit
117: operation reception unit
118: display controller
12: storage unit
121: travel data storage unit
122: driver data storage unit
123: SOC-OCV characteristic storage unit
124: time-series SOH value storage unit
13: display unit
14: operation unit
30: vehicle controller
34: motor
35: inverter
36: wireless communication unit
36a: antenna
38: charging cable
40: battery system
41: battery module
42: management unit
43: voltage measurement unit
44: temperature measurement unit
45: current measurement unit
46: battery controller
46a: SOC-OCV map

The invention claimed is:
1. A computing system comprising:
at least one processor configured to:
acquire travel data including data of each of batteries, the batteries being respectively mounted in each of a plurality of electrically-driven mobile units;
identify a state of health of each of the batteries based on the battery data included in the travel data acquired;
perform curve regression on a plurality of data points of the states of health identified in time series for each of the batteries to generate a deterioration regression curve for each of the batteries;
generate a regression function having (i) a deterioration coefficient of the deterioration regression curve of the batteries as a dependent variable and (ii) an average travel distance or an average discharge amount per unit period of the plurality of electrically-driven mobile units as an independent variable;
predict a remaining life of a specific battery among the batteries based on a set state of health that is set to be a life of each of the batteries and a deterioration regression curve of the specific battery;
receive a change in travel conditions of an electrically-driven mobile unit in which the specific battery is mounted among the plurality of electrically-driven mobile units, the change being input by a user;
identify the average travel distance or the average discharge amount per unit period in accordance with the change received in the travel conditions;
apply the average travel distance or the average discharge amount per unit period to the regression function of the deterioration coefficient to identify a deterioration coefficient after the change in the travel conditions; and
change the deterioration regression curve of the specific battery mounted in the electrically-driven mobile unit, using the deterioration coefficient.
2. The computing system according to claim 1, wherein the processor is configured to calculate the average travel distance per unit period of each electrically-driven mobile unit based on a cumulative travel distance acquired from each electrically-driven mobile unit and a period of service of each electrically-driven mobile unit.
3. The computing system according to claim 1, wherein the processor is configured to:
generate the regression function using the average discharge amount per unit period of the plurality of electrically-driven mobile units as the independent variable;
receive a change in the average travel distance per unit period of an electrically-driven mobile unit in which a corresponding battery among the plurality of batteries is mounted; and
convert the average travel distance per unit period received into the average discharge amount per unit period based on electricity consumption of the corresponding electrically-driven mobile unit.
4. The computing system according to claim 1, wherein the processor is configured to:
calculate, as a remaining life of the corresponding battery, at least one of a remaining usable period of the corresponding battery and a remaining travelable distance of the electrically-driven mobile unit in which the corresponding battery is mounted based on a deterioration regression curve after a change in the corresponding battery; and
display the calculated one on a display unit.
5. A battery deterioration predicting method comprising:
acquiring travel data including data of each of batteries, the batteries being respectively mounted in each of a plurality of electrically-driven mobile units;
identifying a state of health of each of the batteries based on the battery data included in the travel data acquired;
performing curve regression on a plurality of the states of health identified in time series for each of the batteries to generate a deterioration regression curve for each of the batteries;
generating a regression function having (i) a deterioration coefficient of the deterioration regression curve of the batteries as a dependent variable and (ii) an average travel distance or an average discharge amount per unit period of the plurality of electrically-driven mobile units as an independent variable;
predicting a remaining life of a specific battery among the batteries based on a set state of health that is set to be a life of the battery and a deterioration regression curve of the specific battery;
receiving a change in travel conditions of an electrically-driven mobile unit in which the specific battery is mounted among the plurality of electrically-driven mobile units, the change being input by a user; and identifying the average travel distance or the average discharge amount per unit period in accordance with the change received in the travel conditions, applying the average travel distance or the average discharge amount per unit period to the regression function of the deterioration coefficient to identify a deterioration coefficient after the change in the travel conditions, and using the deterioration coefficient to change the deterioration regression curve of the specific battery mounted in the electrically-driven mobile unit.

6. A non-transitory computer-readable medium storing a battery deterioration predicting program configured to cause a computer to execute processing of:

acquiring travel data including data of each of batteries, the batteries being respectively mounted in each of a plurality of electrically-driven mobile units;

identifying a state of health of each of the batteries based on the battery data included in the travel data acquired;

performing curve regression on a plurality of the states of health identified in time series for each of the batteries to generate a deterioration regression curve for each of the batteries;

generating a regression function having (i) a deterioration coefficient of the deterioration regression curve of the batteries as a dependent variable and (ii) an average travel distance or an average discharge amount per unit period of the plurality of electrically-driven mobile units as an independent variable;

predicting a remaining life of a specific battery among the batteries based on a set state of health that is set to be a life of the battery and a deterioration regression curve of the specific battery;

receiving a change in travel conditions of an electrically-driven mobile unit in which the specific battery is mounted among the plurality of electrically-driven mobile units, the change being input by a user; and identifying the average travel distance or the average discharge amount per unit period in accordance with the change received in the travel conditions, applying the average travel distance or the average discharge amount per unit period to the regression function of the deterioration coefficient to identify a deterioration coefficient after the change in the travel conditions, and using the deterioration coefficient to change the deterioration regression curve of the specific battery mounted in the electrically-driven mobile unit.

* * * * *